(12) United States Patent
Perner (10) Patent No.: US 6,590,804 B1
(45) Date of Patent: Jul. 8, 2003

(54) ADJUSTABLE CURRENT MODE DIFFERENTIAL AMPLIFIER

(75) Inventor: Frederick A. Perner, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/198,278

(22) Filed: Jul. 16, 2002

(51) Int. Cl.[7] .......................... G11C 11/00; G11C 7/02
(52) U.S. Cl. ...................................... 365/158; 365/210
(58) Field of Search ................................ 365/158, 210

(56) References Cited

U.S. PATENT DOCUMENTS

| | | | | |
|---|---|---|---|---|
| 5,717,640 A | * | 2/1998 | Hashimoto | 365/210 |
| 6,169,686 B1 | | 1/2001 | Brug et al. | 365/158 |
| 6,262,625 B1 | | 7/2001 | Perner et al. | 330/2 |
| 6,307,797 B1 | * | 10/2001 | Fournel et al. | 365/210 |
| 6,421,270 B1 | * | 7/2002 | Tai | 365/158 |
| 6,501,697 B1 | * | 12/2002 | Perner et al. | 365/158 |
| 6,504,752 B2 | * | 1/2003 | Ito | 365/158 |

* cited by examiner

Primary Examiner—Trong Phan (57) ABSTRACT

An adjustable current mode differential sense amplifier is provided. The amplifier is disposed to be in communication with a selected memory cell and a reference cell having a predetermined value. The amplifier is able to sense current and voltage changes associated with the selected memory cell and compare them to current and voltage changes associated with the reference cell. The operating point of the sensing amplifier may be changed by modifying threshold voltages related to the back gate bias applied to selected transistors in the amplifier. This adjusting capability enables currents or voltages of the sense amplifier to be set when a first bias voltage is applied to a selected memory cell in order to maximize the sensitivity of the amplifier. When a second bias voltage is applied to the memory and reference cells in order to determine the memory cell value, the amplifier is able to sense slight changes in the currents or voltages associated with the selected memory cell and the reference cell and compare them to determine the state of the memory cell. This increased sensitivity enables the amplifier to have a substantially increased dynamic range without introducing components that might adversely affect the memory circuitry parameters.

24 Claims, 6 Drawing Sheets

ADJUSTABLE CURRENT MODE DIFFERENTIAL AMPLIFIER

BACKGROUND OF THE INVENTION

1. Field of Invention

The present invention pertains to the field of memory sense amplifiers. More particularly, this invention relates to memory differential sense amplifiers having adjustable sense and reference circuitry.

2. Background

In a random access memory (RAM) array, an amplifier is used to sense the state of an addressed memory cell and provide a signal representing the sensed state to the output of the array. This sense amplifier takes different forms, depending on the type of RAM array. In a static random access memory (SRAM) array or dynamic random access memory (DRAM) array, the memory is often volatile, that is, not retaining the data when the array is powered off. Such memories are often complex and require complex sensing circuitry such as steering (decoder) circuits and clocked, current mode amplifiers.

In contrast, a non-volatile memory array, such as a cross-point array, utilizes very simple compact memory cells, such as the cross-point type, concerned with long-term retention, high density and fast access. A non-volatile array may be a write-once type having a fuse or anti-fuse at each cross-point cell, or a multiple read-write variety, such as a magnetic random access memory (MRAM) array having cross-point magnetic cells each capable of changing between two or more states.

One problem with resistive memory arrays, such as arrays using MRAM cells, is the difficulty in accurately determining the logic state of a memory cell. This problem arises because the cell states are not measured by conductance or non-conductance, as in an anti fuse memory. Rather the MRAM cell states are determined by minute differences in the conductivity of a thin insulating junction embedded within the MRAM memory cell caused by the relative direction of the magnetization of ferromagnetic layers adjacent to the thin insulating junction. Typically, the states of an MRAM cell are determined by a data magnetic layer having a magnetic moment either "parallel" or "anti-parallel" relative to a fixed magnetic layer. The states are measured by a difference in the resistance caused by the magnetism of the data layer being "parallel" or "anti-parallel" to the fixed layer. This resistance is sensed by the current flow through the insulation layer and the magnitude of the sense current is typically on the order of 500 nA, and the difference in the current between the "parallel" and the "anti-parallel" states is typically about 50 nA.

Accordingly, it is crucial to carefully sense small variations in the sensed current through a selected memory cell, in order to accurately determine the logic state of the cell. One common sense amplifier is a current mode sense amplifier where the memory cell current must be sensed by a circuit that depends on a precision current mirror as part of the sense amplifier. Thus, for current mode sense amplifiers, it is also important to provide an accurate "mirror" of the sensed current from the cell to the sense amplifier, as well as to provide a means of measuring the sensed current against a reliable standard to determine the state of the cell.

In addition, there is a greater need for higher density memory devices to meet the memory requirements of increasingly complex devices. This demand has lead to increased miniaturization and more compact data storage than ever before. Efforts are now underway to adapt technology to enable the storage of data on a scale of nanometers to tens of nanometers, sometimes referred to as atomic resolution storage. This size reduction and compactness of memory devices requires smaller voltages and currents, resulting in the need for greater preciseness in measuring the currents and voltages to accurately determine the data in the cell.

In dealing with miniaturized circuits and extremely small currents and voltages, it is important to minimize the intrusive nature of the sensing function. Each element that is used in a sensing circuit may contribute to voltage and current distortions or leakages that will have an impact on the measurement accuracy of the sensor. Accordingly, it is imperative that a sense amplifier for high-density memory cells must minimize any intrusions into the memory matrix that could result in adverse affects on the parameters being sensed.

Voltage mode sense amplifiers sometimes require complex circuitry to achieve accuracy. For example, one voltage mode differential amplifier requires five transistors in a complex circuit to carry out the necessary sensing, as seen in U.S. Pat. No. 6,262,625, granted to Perner et al. on Jul. 17, 2001. In that circuit, back gate digital controlled voltages are applied to a pair of transistors so that the sense amplifier offset parameters may be incrementally adjusted. Back gate digital control values are stored in a register memory to control the precision of the sense amplifier, further increasing the complexity of the sensing circuit.

Current mode sense amplifiers are sometimes used for high density, sensitive memory matrix sensing. However, current mode sense amplifiers tend to require a high level of component matching because of the limited dynamic range of such a circuit. If the current of the reference cell is substantially different than the current of the memory cell being sensed, the current mode sense amplifier may not be able to accurately determine the logic state of the memory cell. Adding components, such as additional sense resistors, may compensate for this limited range problem. However, the addition of components to a current sense circuit tends to adversely affect the circuits being sensed.

Other sense amplifiers use analog to digital conversion (ADC) to measure the sense and reference currents and compare them digitally. This approach is useful in extending the dynamic range of the components. However, the increased complexity of the sensing circuit is an important disadvantage.

Accordingly, a simple sensing amplifier is needed for measuring memory cell matrices at very low levels of sense currents and voltages. Sensing components are needed that will accurately mirror the sense parameters and reflect them to the sensing circuit. In addition, a sense amplifier is needed that uses a small number of components so that the intrusion into a memory matrix is minimized. Finally, it is important that a sensing amplifier have a relatively wide dynamic range for accommodating different levels of currents and voltages.

SUMMARY OF THE INVENTION

The present invention provides a useful and unique sensing circuit in the nature of an adjustable current mode differential sense amplifier. The amplifier is in communication with a selected memory cell and a reference cell having a predetermined value. The amplifier is able to sense current and voltage changes associated with the selected memory cell and compare them to current and voltage changes associated with the reference cell.

The operating point of the sensing amplifier may be changed by modifying the threshold voltage of isolated transistors in the sense amplifier. This is accomplished in a non-invasive manner by applying a control voltage on back gate electrodes of the isolated transistors. This adjusting capability enables currents or voltages of the sense amplifier to be set when a first bias voltage is applied to a selected memory cell in order to maximize the sensitivity of the amplifier. When a second bias voltage is applied to the memory and reference cells in order to determine the memory cell value, the amplifier is able to sense slight changes in the currents or voltages associated with the selected memory cell and the reference cell and compare them to determine the state of the memory cell. This increased sensitivity enables the amplifier to have a substantially increased dynamic range without introducing components that might adversely affect the memory circuitry parameters.

An apparatus embodiment of the present invention comprises a sensing circuit for determining the logic state of a memory cell in a resistive memory device. The circuit includes a reference cell having a pre-selected logic state. A memory cell sensing circuit is adapted to determine a first memory cell voltage associated with the memory cell when a first bias voltage is impressed on the memory cell and to determine a second memory cell voltage associated with the memory cell when a second bias voltage is impressed on the memory cell. A reference cell sensing circuit is adapted to determine a first reference cell voltage associated with the reference cell when the first bias voltage is impressed on the reference cell and to determine a second reference voltage associated with the reference cell when the second biasing voltage is impressed on the reference cell. An adjusting circuit is used to modify either the first reference cell voltage or the first memory cell voltage so that the first reference cell voltage is equal to the first memory cell voltage at the first bias voltage. A state determining circuit is disposed to sense the difference between the second memory cell voltage and the second reference cell voltage at the second bias voltage in order to determine the logic state of the memory cell.

Similar to the above apparatus embodiment, a method embodiment of the present invention is a method for determining the logic state of a memory cell in a resistive memory device, using a reference cell previously set to a known logic state. The method comprises determining the logic state of a memory cell in a resistive memory device relative to a reference cell having a pre-selected logic state. A first memory cell voltage associated with the memory cell and a first reference cell voltage associated with the reference cell are sensed when a first bias voltage is impressed on the memory cell and the reference cell. The first memory cell voltage or the first reference cell voltage is then adjusted using a non-invasive back gate control voltage so that the first reference cell voltage and the first memory cell voltage are approximately equal to each other. Next, a second memory cell voltage associated with the memory cell and a second reference cell voltage associated with the reference cell are sensed when a second bias voltage is applied to the memory cell and to the reference cell. Then the difference between the second memory cell voltage and the second reference cell voltage is measured to determine the logic state of the memory cell.

It should be understood that, for both the apparatus and method embodiments described above, rather than sensing and adjusting the first and second memory cell voltages and the first and second reference cell voltages, other parameters associated with the memory cell and reference cell, such as current or resistance, may be sensed and adjusted in order to determine the state of a selected memory cell. The scope of the present invention is meant to include selecting any parameter associated with the selected memory cell and the reference cell to be sensed and adjusted according to the principles of the present invention.

Other aspects and advantages of the present invention will become apparent from the following detailed description, which in conjunction with the accompanying drawings illustrates by way of example the principles of the present invention.

DETAILED DESCRIPTION OF EMBODIMENTS OF THE INVENTION

Figure 1:
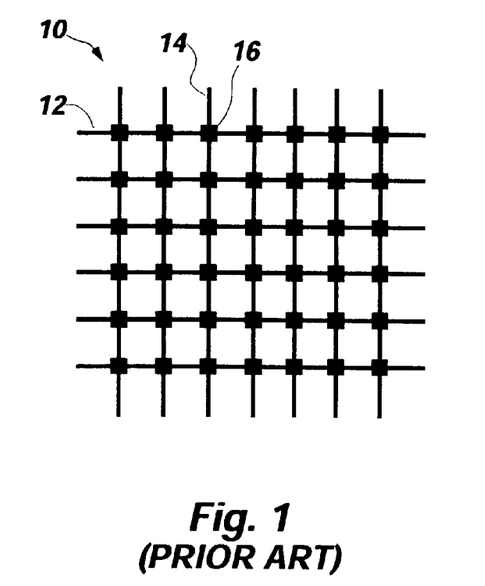
FIG. 1 is a schematic view showing a prior art resistive cross point memory device according to the present invention.

FIG. 1 shows a typical prior art cross-point memory array 10. The row conductors 12 running in one direction are referred to as the word lines, and the column conductors 14 extending in a second direction usually perpendicular to the first direction are referred to as the bit lines. The memory cells 16 are usually arranged in a square or rectangular array so that each memory cell unit 16 is connected with one word line 12 and an intersecting bit line 14.

In a resistive RAM array, the resistance of each memory cell has more than one state, and the data in the memory cell may be determined by measuring the resistive state of the cell. The resistive memory cells may include one or more magnetic layers, a fuse or antifuse, or any element that stores or generates information by affecting the magnitude of the nominal resistance of the element. Other types of resistive elements used in a resistive RAM array include poly-silicon resistors as part of a read-only memory, and floating gate transistors as part of optical memory, imaging devices or floating gate memory devices.

One type of resistive random access memory is a magnetic random access memory (MRAM), in which each memory cell is formed of a plurality of magnetic layers separated by insulating layers. One magnetic layer is called a pinned layer or reference layer, in which the magnetic orientation is fixed so as not to rotate in the presence of an applied magnetic field in the range of interest. Another magnetic layer is referred to as a sense layer or data layer, in which the magnetic orientation is variable between a state aligned with the state of the pinned layer and a state in misalignment with the state of the pinned layer. An insulating tunnel barrier layer sandwiches between the magnetic pinned layer and the magnetic sense layer. This insulating tunnel barrier layer allows quantum mechanical tunneling current to flow between the sense layer and the pinned layer when an external sense voltage is applied. The tunneling is electron spin dependent, causing the resistance of the memory cell to be a function of the relative orientations of the magnetizations of the sense layer and the pinned layer. The variations in the junction resistance for the two states of the sense layer determine the data stored in the memory cell. U.S. Pat. No. 6,169,686, granted to Brug et al. on Jan. 2, 2001 discloses such a magnetic memory cell memory.

Figure 2:
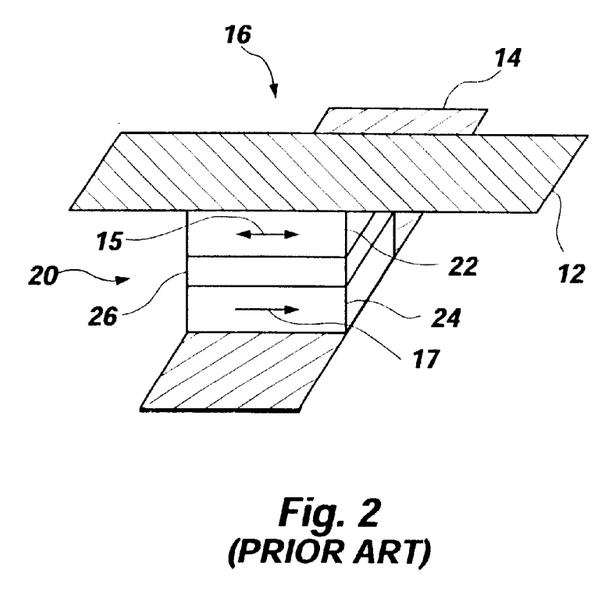
FIG. 2 is a schematic view showing the prior art structure of a MRAM memory cell and the conductors connected thereto.

Referring to FIG. 2, an MRAM memory cell is shown. Memory unit 16 is shown as a three-layer magnetic tunnel junction (MTJ) memory cell 20. In each cell MTJ 20 a bit of information is stored according to the orientation of a changeable magnetic sense layer 22 of the cell 20. Usually, the cell 20 has two stable magnetic states corresponding to the logic states "1" and "0." The two-way arrow 15 on the sense layer 22 shows this binary-state capability. A pinned layer 24 in the cell 20 is separated from the sense layer by a thin insulator 26. The resistance across the MTJ memory cell 20 is determined by the characteristics of thin insulator 26 and the orientation of the changeable magnetic sense layer 22.

Pinned layer 24 has a fixed magnetic orientation, such as shown by the one-way arrow 17 on layer 24. When the magnetic state of the sense layer 22 is oriented in the same direction as the direction of the magnetization of the pinned layer 24, the cell magnetization is referred to as "parallel." Similarly, when the magnetic state of the sense layer 22 is oriented in the direction opposite to the direction of the magnetization of the pinned layer 24, the cell magnetization is referred to as "anti-parallel." These orientations correspond to a low resistance state and a high resistance state, respectively. Arbitrarily, the parallel state might be considered to correspond to a "0" state or logic value of the memory cell and the anti-parallel state might be considered to correspond to a "1" state, although the assignment of "0" and "1" states might be reversed, if desired.

The magnetic state of a selected memory cell 20 may be changed by applying currents to a word line 12 and a bit line 14 crossing the selected memory cell. The currents produce two orthogonal magnetic fields that, when combined, will switch the magnetic orientation of the sense layer of the selected memory cell 20 between the parallel and anti-parallel states. Other unselected memory cells receive only a magnetic field from either the word line or the bit line crossing the unselected memory cells. The single field is not strong enough to change the magnetic orientation of the sense layer of the unselected cells, so they retain their magnetic orientation.

As explained above, in resistive memory cell devices, the difference in memory cell logic states is determined by the difference in resistance of a memory cell in a parallel state and in an anti-parallel state. As seen in graph 30 in FIG. 3, the resistance level of resistive cells, particularly MRAM cells, has been found to vary with the application of different levels of bias voltages to the cells. Generally, the resistance of resistive cells has been found to decrease with an increase in bias voltage. Cells in the anti-parallel state, shown by line 32, have a higher resistance value than cells in the parallel state, shown by line 34.

Figure 3:
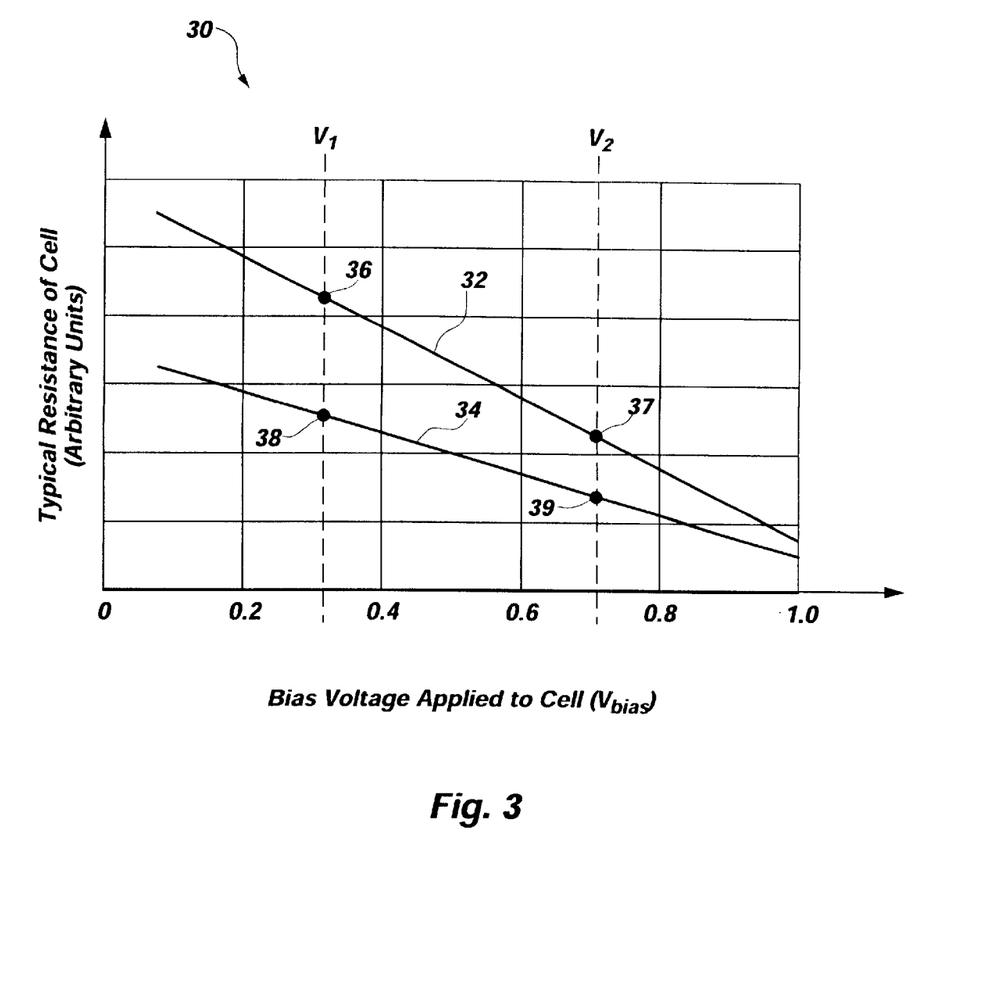
FIG. 3 is a graphical illustration of the resistance values of a MRAM memory cell measured as a function of applied bias voltage for two different logic states of the cell.

It has been found that the resistance of cells in the anti-parallel state normally decrease at a much more rapid rate than the resistance of cells in the parallel state with an increase in bias voltage, as can be seen by comparing the slope of line 32 to that of line 34. As is well known in the art, this dynamic difference in resistance at different bias voltages is a consistent trait of magnetic tunnel junction (MTJ) memory devices that is typically quantified by determining the tunneling magneto-resistance ratio (TMR) of a MTJ device.

This dynamic difference in the resistances of cells in the anti-parallel and parallel states has been exploited in a two-sample method described in co-pending patent application Ser. No. 10/055,299 entitled "System and Method For Determining the Logic State of a Memory Cell in a Magnetic Tunnel Junction Memory Device" . In this method the memory cell current is sampled at two different bias voltages, $V_1$ and $V_2$, and the ratio of the first and second current values 36 and 37 (anti-parallel state) or 38 and 39 (parallel state) is compared to a predetermined value to determine the logic state of a memory cell. The predetermined value can be stored in a table or determined from a reference cell having a known logic state.

Since the slope or gradient of the curve 32 for the anti-parallel state is considerably greater than the slope of the curve 34 for the parallel state, the corresponding ratios of the two measurements at different bias voltages will easily determine the logic state of the memory cell.

In the present invention, the reference values are provided by a reference cell that is subjected to the same bias voltages as the memory cell. A sense circuit compares the currents in both the reference cell and the memory cell at selected bias voltages by comparing both the sense and reference currents in the sense circuit. The reference and sense currents result in reference and sense voltages at the input nodes of the sense circuit that vary depending on the bias voltages applied to the reference and memory cells. At a first bias voltage, the sense circuit is adjusted so that the first reference voltage is approximately the same value as the first sense voltage. This adjustment proportionately reduces the difference between the first reference voltage and the first sense voltage at the first bias voltage measurement point, thus enabling a close tuning of the circuit. Accordingly, the dynamic range of the current sampling is improved by eliminating common mode differences between the reference memory element and the sensed memory element.

Figure 4A:
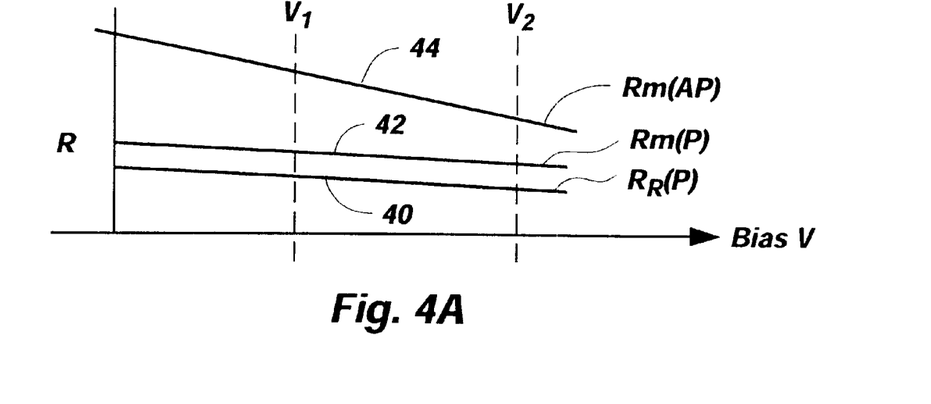
FIGS. 4A, 4B and 4C are graphical illustrations showing the relationship between memory cell resistance to the reference cell resistance at various bias voltages, according to the present invention.
Figure 4B:
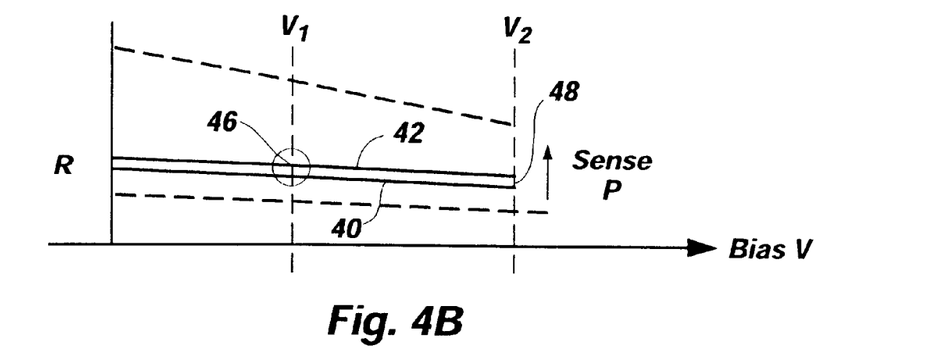
Figure 4C:
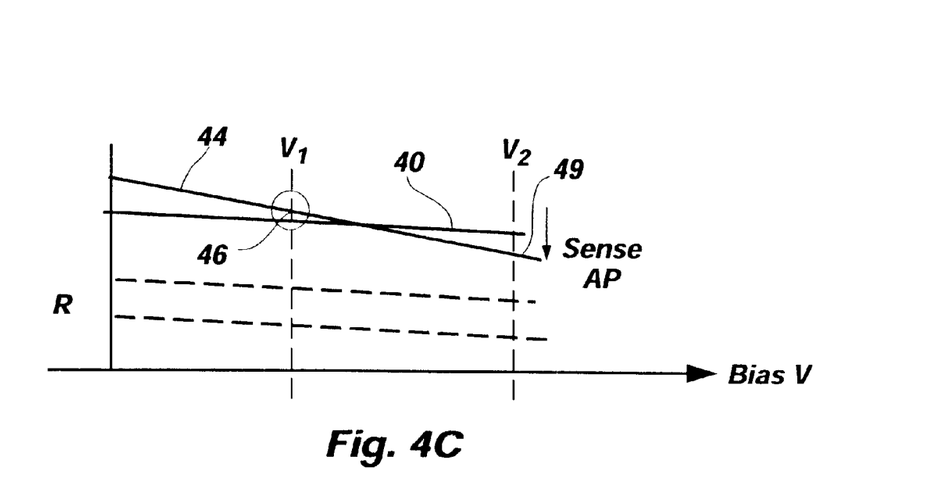

The above arrangement is illustrated in FIGS. 4A, 4B and 4C showing the relationship of an inferred, relative resistance of a memory cell to an inferred relative resistance of a reference cell for different bias voltages and at different memory cell logic states. This resistance relationship is also indicative of the differences in currents and voltages associated with a selected memory cell and the reference cell. The linear relationship of resistances is used here for purposes of simplicity of illustration of the principles applied in the present invention. As will be seen later, it is preferable to sense and adjust the currents indirectly by sensing and adjusting voltages associated with the selected memory cell and the reference cell.

By way of further explanation, FIGS. 4A–C are used to illustrate the concept of sensing a reference element in a known state and comparing it to the selected element. The basic parameter being determined is resistance. However, in this embodiment, the parameters that are actually being sensed by the sense amplifier are voltage and current. In the described sensing arrangement, the sense currents are modified by sneak paths, so it is impossible to make an absolute resistance measurement. Instead relative values of other parameters are sensed, from which resistance values are inferred. In FIGS. 4A–C, the y-axis is the inferred resistance which is a complex function of the applied voltage, amplifier offsets, and sneak path resistances.

As shown by line 40 in FIG. 4A, the reference cell resistance $R_R$ is set to the parallel state $R_R(P)$. In this parallel state, a characteristic of the MRAM cell is a weak dependence on the bias voltage. Thus, there is little change in resistance as the bias voltage changes, so that line 40 has only a slight slope.

The selected memory cell resistance $R_M$ is either in a parallel state $R_M(P)$, as shown by line 42, or an anti-parallel state $R_M(AP)$, as shown by line 44. The voltage dependence of the resistance $R_M$ of the selected cell will be similar to that of the resistance $R_R$ of the reference cell. Thus, line 42 indicates that, if the selected cell is in the parallel state, there will be relatively little change in resistance $R_M(P)$ with a change of bias voltage, compared to line 44 showing the greater slope or change of resistance $R_M(AP)$ of the memory cell in the anti-parallel state with changes in bias voltage. Preferably, the reference cell is located physically near the selected memory cell so that the reference and memory cells share the same or very similar processing and environmental conditions.

It should be noted that the absolute resistance values of the resistances indicated in FIGS. 4A–4C of the selected memory cell and the reference cell do not have to be the same and, in fact, are assumed to be different. These differences in absolute values will not affect the above ratios, as will be explained in more detail below.

FIGS. 4B and 4C show the differences between the relative resistances $R_M$ and $R_R$, depending on whether the selected memory cell is in the parallel state (line 42) or the anti-parallel state (line 44), respectively. As shown in FIGS. 4B and 4C, regardless of the state of the memory cell at the point that the first voltage $V_1$ is applied, the current through $R_R$ of the reference cell is adjusted so that it is nearly the same as the current through $R_M$ of the memory cell. The process of adjusting the current through $R_R$ adjusts the amplifier offset parameters so that the inferred, relative resistance representing the reference element is approximately equal to the inferred, relative resistance representing $R_M$. Preferably, the current through $R_R$ is slightly less than the current through $R_M$, providing a small difference between the current values and a small difference between the inferred relative resistance values, shown as a delta difference 46 in both FIGS. 4B and 4C.

This adjustment in the current through $R_R$ of the reference cell at the time that $V_1$ is applied results in a dramatic difference between currents at $V_2$, depending on the state of the memory cell. As shown in FIG. 4B, if the selected memory cell is in the parallel state, the inferred resistance $R_M$ has little change between $V_1$ and $V_2$, so a delta difference 48 between the inferred resistances $R_M$ and $R_R$ at bias voltage $V_2$ is about the same as the delta difference 46 at bias voltage $V_1$. Accordingly the sensing circuit used to measure this difference will not change substantially in its output value.

In contrast, as shown in FIG. 4C, at the point where the bias voltage $V_2$ is applied, the inferred relative resistance $R_M$ of the selected memory cell in the anti-parallel state shown by line 44 has dropped substantially below the inferred resistance $R_R$ of the reference cell, shown by line 40, resulting in a greater delta difference 49. Moreover, the lines 40 and 44 have crossed, which changes the sign of the delta difference 49.

Since current changes in the sense circuit correspond to inferred, relative resistance changes, the foregoing analysis is indicative of the resistances of the reference and memory cells. Thus, the logic state of the memory cell can be determined by comparing the values of the reference and memory cell currents at the second bias voltage point. If the difference 48 between the values of the memory cell and reference cell currents at the second bias voltage $V_2$ is about the same as the difference 46 between the values of the memory cell and reference cell currents at the first bias voltage $V_1$, then the memory cell resistance is understood to be parallel, (which might be the logic value 0) as shown in FIG. 4B. If the values of the memory cell and reference cell currents have changed and there has been a cross-over of values, and the memory cell is anti-parallel. If the memory cell current is still higher than the reference current, the memory cell is parallel.

Figure 6:
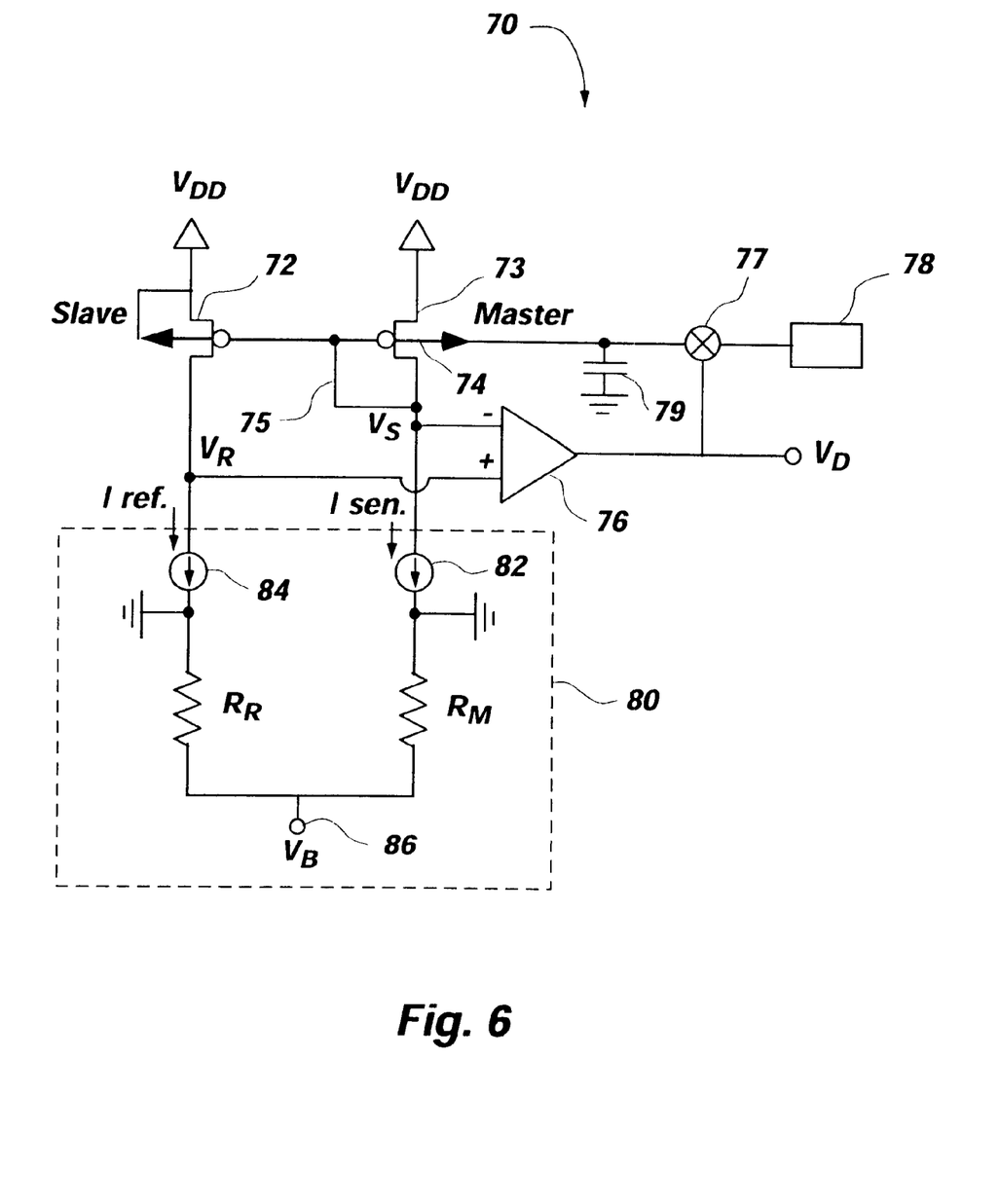
FIG. 6 is a schematic circuit diagram showing one embodiment of the sense amplifier according to the present invention.

A similar analysis may be made for voltages at nodes associated with the memory cell and the reference cell, as will be seen in the discussion regarding the circuitry in FIG. 6.

Figure 5:
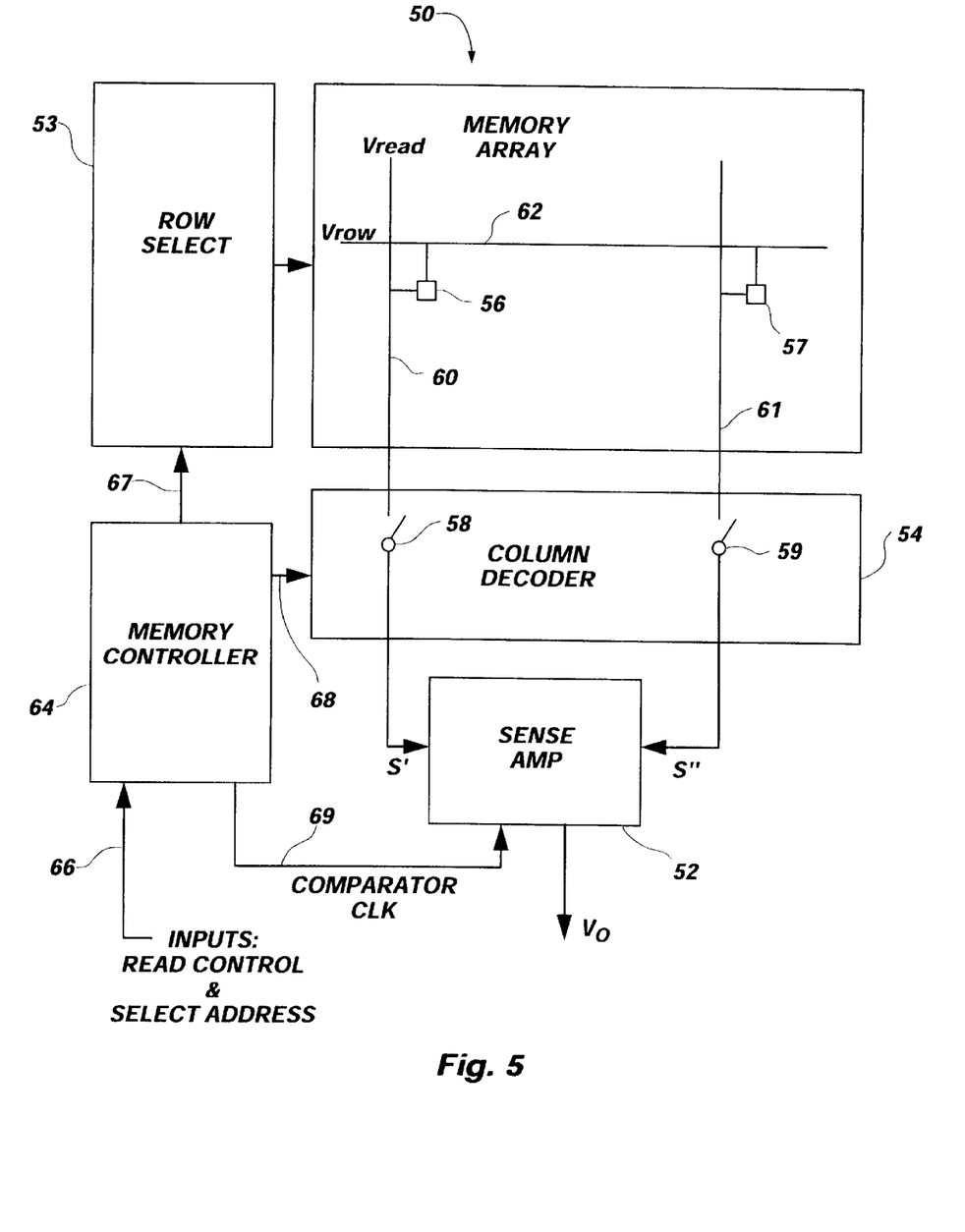
FIG. 5 is a schematic block diagram showing the structure of a MRAM memory cell array and sensing elements, according to the present invention.

Referring now to FIG. 5, a resistive memory array 50 shows one context for the sensing circuit of the present invention. A row selector circuit 53 and a column decoder circuit 54 are connected to the memory array 50 to select a memory cell 56 by providing voltages on the appropriate row and column of cell 56. A sense amplifier 52 is connected through switch 58 in the column decoder circuit 54 to the bit line 60 of the selected memory cell 56. The row selector circuit 53 applies a voltage $V_{row}$ to the word line 62 of the selected memory cell 56, and a voltage $V_{read}$ is applied to the bit line 60.

The same bit line voltage $V_{read}$ is applied to all of the unselected cells along bit line 60. However, the unselected cells do not receive a word line voltage $V_{row}$, so they do not provide any substantial output current on the bit line 60. After selection of the memory cell, an amplifier (not shown) in the sense amp 52 acts to hold column 60 to the voltage $V_{read}$.

A memory controller 64 receives read control and select address signals 66 and provides the appropriate row and column select signals to the row select circuit 53 and the column decoder circuit 54 on lines 67 and 68, respectively. A comparator clock signal 69 is applied to sense amplifier 52, for purposes of clocking an op amp 76, shown in FIG. 6, if a timing pulse is desired. The op amp 76 controls a transmission gate to supply a variable voltage to the back gate of transistor 73, as discussed with respect to the circuitry in FIG. 6.

As shown in FIG. 5, a reference element 57 is connected to word line 62 and reference column line 61. When the voltage $V_{row}$ selects memory cell 56 it also selects reference element 57. After selection, an operational amplifier (not shown) in the sense amplifier 52 acts to hold reference column 61 at read voltage $V_{read}$. Accordingly, reference element 57 is subject to the same voltages applied to the selected memory cell 56.

The sense amplifier 52 receives a signal current at S' from cell 56 indicative of the data stored therein. Likewise, an output signal current at S" from reference element 57 is applied through switch 59 to sense amplifier 52. In turn, sense amplifier 52 compares the sense current at S' from the memory cell to the reference current at S" and provides an output signal $V_O$ indicative of the data stored in memory cell 56.

Looking now at FIG. 6, a sense amplifier 52 is shown that applies the concepts discussed with regard to FIGS. 4A–C above in the context of sensing and adjusting voltages associated with a selected memory cell and the reference cell. Sense amplifier 52 is an adjustable current mode differential amplifier (ACMDA) having a back gate bias control mechanism for adjusting the threshold voltage of the memory cell sensing circuit. The ACMDA is basically a current mirror with an adjustable device. In this embodiment, P channel MOSFET transistors are used. However, it is possible to use N channel transistors, as shown later. NPN or PNP bipolar transistors may also be used to accomplish the purpose of the invention.

An embodiment of sense amplifier 52 is shown in the ACDMA 70 shown.in FIG. 6, wherein the gates of a "slave" transistor 72 and a "master" transistor 73 are connected together to form a mirror device. The mirror device is adjusted so that the $V_{DS}$ voltage (drain to source voltage, not shown) across the slave transistor 72 is equal to the $V_{DS}$ voltage across the master transistor 73. Since identical voltages $V_{DD}$ are applied to the sources of transistors 72 and 73 and since the voltages $V_{DS}$ across the two transistors are equal, the voltages $V_R$ and $V_S$ at the drain nodes of transistors 72 and 73, respectively, will be equal as well.

The gate of the master transistor 73 is connected to the drain of the master transistor 73 by connector 75. This connection creates a control potential $V_{GS}$ (gate to source voltage, not shown) between the master gate and the master source, based on the drain current $I_D$, which is the same as $I_{sen}$, as shown. The control potential $V_{GS}$ is applied to the gate of the slave transistor 72 which in turn develops a drain current $I_D$ in slave transistor 72, which is the same as $I^{ref}$, as shown. Since $V_S$ is equal to $V_R$, then $I_{sen}$ and $I_{ref}$ will be proportional to the physical design and size of the respective transistors. The sense and reference currents $I_{ref}$ and $I_{sen}$ flow through generalized circuitry 80 associated with the memory cell $_{RM}$ and the reference cell $R_R$.

It is important to understand that the voltage $V_{DS}$ across the master transistor 73 is equal to the voltage $V_{DS}$ across the slave transistor 72. When these voltages are equal, the relationship between the respective currents $I_{ref}$ and $I_{sen}$ is determined by only the physical parameters of the respective transistors 73 and 72. If there is an imbalance in currents, the voltage relationship will indicate the current imbalance and the direction of the current imbalance.

The drain of the master transistor 73 is connected to a node having a voltage $V_S$ which is the negative input of an operational amplifier 76. The drain of the slave transistor 72 is connected to a node having a voltage $V_R$ which is the positive input of the operational amplifier 76. The op-amp 76 output $V_O$ is connected to a transmission gate 77 that selectively connects a ramp generator 78 to the back gate 74 of master transistor 73. A capacitor 79 is connected in parallel with back gate 74 to maintain the voltage of the back gate.

The connection between the sense amplifier 70 and circuitry 80 incorporating the memory cell-and the reference cell can take different forms. The generalized form given in FIG. 6 shows a sense current generator 82 connected between $V_S$ and ground. Similarly, a reference current generator 84 is connected between $V_R$ and ground.

A selected memory cell $R_M$ is connected between ground and an input node 86 for the bias voltages $V_{B(1)}$ and $V_{B(2)}$. Likewise, a reference cell $R_R$ is connected between ground and the input node 86. The current generators 82 and 84 are representations of current being generated in the respective sense and reference circuits in response to the bias voltage inputs. It should be noted that the nodes for $V_S$ and $V_R$ in FIG. 6 correspond to bit lines 60 and 61, respectively, in FIG. 5. Similarly, resistors $R_M$ and $R_R$ in FIG. 6 correspond to the memory elements 56 and 57, respectively, in FIG. 5.

The circuitry 80 is the subject of separate but related inventions described in Applicants' copending applications entitled "Multiple Bias Point MRAM With An Adjustable Current Mode Sense Amplifier and Equi-potential Isolation" Ser. No. 10/62,051 and "Multiple Bias Point MRAM With An Adjustable Current Mode Sense Amplifier and Diode Isolation Ser. No. 10/261,532.

The first step in setting up the sense amplifier 70 is to establish the back gate bias connection for setting $V_S$ equal to $V_R$ at given initial values of $I_{sen}$ and $I_{ref}$ where N times $I_{ref}$ equals $I_{sen}$. N is the physical mirror ratio, defined as: $N=(W/L_{ref})/(W/L_{sen})$. If N=1, then the slave current. $I_{ref}$ will be equal to the master current $I_{sen}$ when $V_S=V_R$. However, the variation of the back gate voltage $V_{BG}$, applied to just the master transistor 73 may require potentials greater than $V_{DD}$ to adjust the threshold of the master transistor 73 so that $I_{sen}$ is equal to $I_{ref}$. In principle, this can be done, but in practice it is difficult to generate voltages greater than the supply voltage $V_{DD}$.

Therefore, N is set to be greater than 1, so that only voltages less than $V_{DD}$ need to be applied to the back gate to achieve a $V_S=V_R$ balance for the applied $I_{sen}$ and $I_{ref}$ One embodiment uses N equal to 2 in a 3.3, volt 0.5 micron CMOS technology, where W/L is 20/1 for the slave transistor and W/L is 10/1 for the master transistor, $I_{sen}$ and $I_{ref}$ are approximately equal at about 500 nanoamps and the back gate voltage $V_{BG}$ (not shown) is about 3.2 volts. Similar relationships and values would apply for N channel transistors and bipolar transistor circuits.

To establish the back gate bias connection mentioned above, one technique is to use a basic five transistor CMOS op-amp 76 having $V_S$ and $V_R$ as inputs. Op-amp 76 determines when $V_S$ is greater than or less than $V_R$ and applies an output signal $V_O$ to a transmission gate 77. This output signal opens the transmission gate 77 and connects a ramp generator 78 to the back gate of the master transistor 73, thereby adjusting the operating point of the master transistor 73 so that $V_R$ is approximately equal to $V_S$. At that point, the output signal $V_O$ changes, closing the transmission gate 77 and disconnecting the ramp generator 78 from the back gate of the master transistor 73.

The following sequence gives the steps in greater detail for adjusting the back gate voltage of the master transistor 73 to set $V_R$ approximately equal to $V_S$ with a first bias voltage $V_{B(1)}$ applied to the selected memory cell and the reference cell:

(1) Start with $V_{BG}$"master"=$V_{DD}$.

(2) $I_{sen}$ (at $V_{BG}=V_{DD}$) is greater than $I_{sen}$ (at $V_{BG}$ such that $V_R$ is equal to $V_S$), so that $I_{sen}$ is greater than $I_{ref}$.

(3) $V_{BG}=V_{DD}$ setup leads to $V_R$ is greater than $V_S$ leads to $V_O$ approximately equals $V_{DD}$, which is a logic 1.

(4) $V_O$=logic 1is applied to turn ON the transmission gate. Transmission gate ON leads to $V_{BG}=V_{ramp}$ (5) The backgate voltage is linearly reduced from $V_{DD}$ to a second lower voltage. (If $V_{DD}$ is 3.3 volts the second lower voltage may be 3.0 volts.)

(6) At some time during the application of $V_{ramp}$ the backgate voltage will reach a point where $V_S=V_R$. At that point, the op-amp 76 will switch its output from a logic 1to a logic 0. The transmission gate 77 will be turned off, isolating the back gate voltage $V_{BG}$ from $V_{ramp}$ and storing the value of $V_{ramp}$ (for $V_R=V_S$) on the back gate node 74 of master transistor 73 for the duration of the sensing function by means of a capacitor 79.

(7) At this point the setup is complete. The back gate voltage $V_{BG}$ is stored for the duration of the sensing step. This action maintains $V_R$ and $V_S$ substantially equal during the sensing function, so that $I_{sen}$ and $I_{ref}$ will vary with the sensing of a memory cell and reference cell, respectively.

The ACMDA is now ready to sense the state of memory cells. A second bias voltage $V_{B(2)}$ is applied at a higher value than the first bias voltage $V_{B(1)}$. If $I_{sen}$ changes so that $I_{sen}$ is less than $I_{ref}$, $V_R$ will be pulled down so that $V_S$ is greater than $V_R$. At that point, the output $V_O$ of op-amp 76 will go to a logic "0". If $I_{sen}$ is greater than $I_{ref}$, $V_S$ will get pulled down so that $V_R$ is greater than $V_S$ and the output $V_O$ of the op-amp 76 will go to a logic "1".

The above embodiment describes adjusting the back gate voltage of the master (sense) transistor, in order to make the sense voltage and the reference voltage equal to each other. It is understood that the back gate voltage of the slave (reference) transistor may be adjusted instead or both back gate voltages may be adjusted to accomplish the same result.

Figure 7:
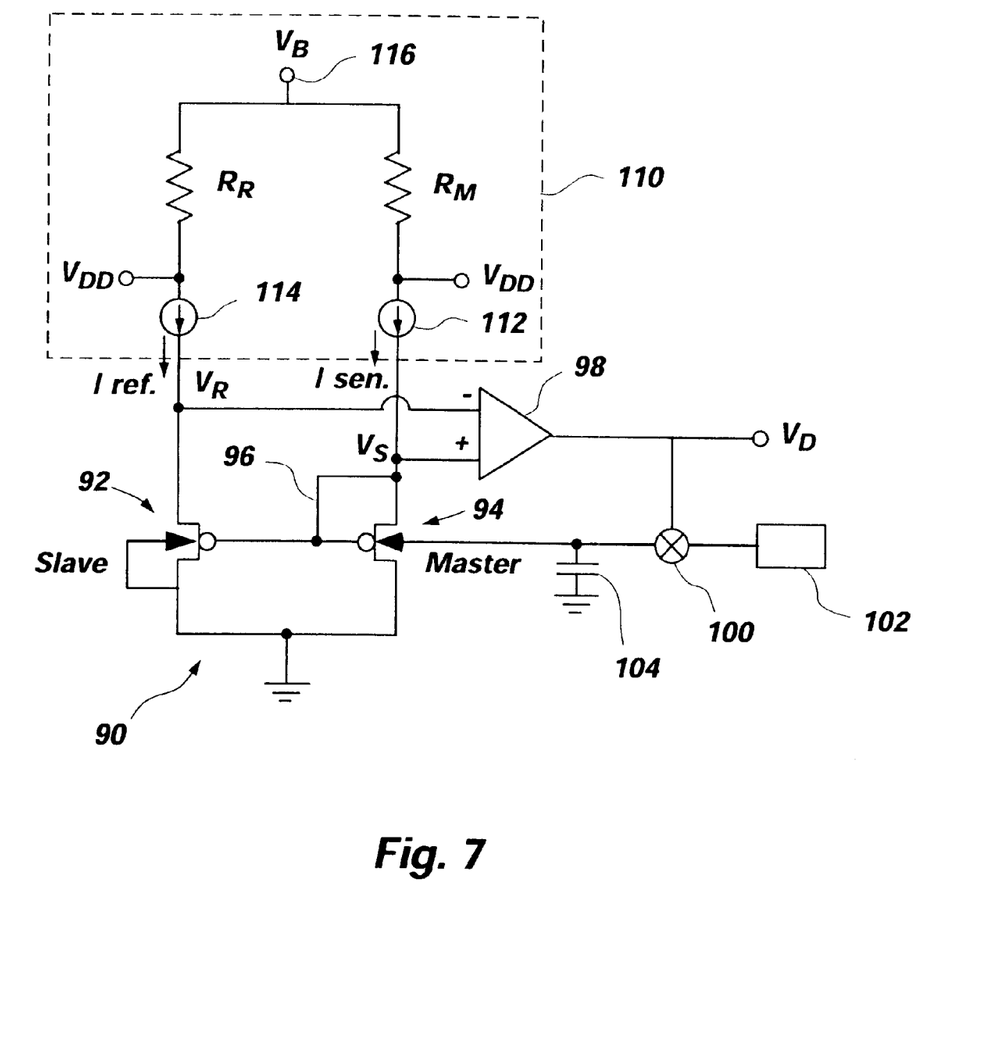
FIG. 7 is a schematic circuit diagram showing another embodiment of the sense amplifier according to the present invention.

Looking now at FIG. 7, N channel MOSFET transistors in a P-well CMOS process are applied instead of the P channel transistors used in the embodiment shown in FIG. 6. Accordingly, the circuitry layout is essentially an inverted mirror image of the circuitry shown in FIG. 6. A master transistor 94 and a slave transistor 92 have common gates connected together, which are also connected by line 96 to the drain of transistor 94. The drain of transistor 94 is also connected to a node having a voltage $V_S$ forming the positive input to an op-amp 98. The drain of transistor 92 is also connected to a node having a voltage $V_R$ forming the negative input to op-amp 98. The output of op-amp 98 controls a transmission gate 100 that selectively connects a ramp generator 102 to the back gate of master transistor 94.

The drain of transistor 94 is also connected to a node providing the sense voltage $V_S$, as well as to a current generator 112 that has the other side connected to $V_{DD}$. Similarly, the drain of transistor 92 is connected to a node providing the reference voltage $V_R$, as well as to a current generator 114 having the other side connected to $V_{DD}$ The input node 116 is connected through the memory cell $R_M$ to $V_{DD}$ and also through the reference cell $R_R$ to $V_{DD}$ A description of sense circuitry 90 is apparent to a person of ordinary skill in the art referring to the description given with regard to FIG. 6.

One of the advantages of the above described ACMDA circuits is that a simple differential current sensor circuit using the back gate bias techniques can be applied to sense selected memory cells using a reference cell for applications where the initial currents through the respective memory and reference cells are not equal. When the current relationship of the memory and reference cell changes, the sensor circuit will detect the changes and compare the changes to determine the state of the selected memory cell.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. A sensing circuit for determining the logic state of a memory cell in a resistive memory device relative to a reference cell having a pre-selected logic state, comprising:

(a) a memory cell sensing circuit adapted to determine a first memory cell parameter associated with the memory cell when a first bias voltage is impressed on the memory cell and to determine a second memory cell parameter associated with the memory cell when a second bias voltage is impressed on the memory cell, (b) a reference cell sensing circuit adapted to determine a first reference cell parameter associated with the reference cell when the first bias voltage is impressed on the reference cell and to determine a second reference cell parameter associated with the reference cell when the second bias voltage is impressed on the reference cell, (c) an adjusting circuit for modifying the first memory cell parameter and/or the first reference cell parameter to make the memory cell parameter approximately equal to the reference cell parameter at the first bias voltage, and (d) a state determining circuit for determining the difference between the second memory cell parameter and the second reference cell parameter in order to determine the logic state of the memory cell at the second bias voltage.

2. The sensing circuit of claim 1, wherein the memory cell sensing circuit is adapted to determine a first memory cell voltage on a memory cell node associated with the memory cell when a first bias voltage is impressed on the memory cell and to determine a second memory cell voltage on the memory cell node when a second bias voltage is impressed on the memory cell.

3. The sensing circuit of claim 2, wherein the reference cell sensing circuit is adapted to determine a first reference cell voltage on a reference cell node associated with the reference cell when the first bias voltage is impressed on the reference cell and to determine a second reference cell voltage on the reference cell node when the second bias voltage is impressed on the reference cell.

4. The sensing circuit of claim 1 wherein the state determining circuit comprises a device for comparing (i) the difference between the memory cell parameter and the reference cell parameter to (ii) a threshold value to determine the logic state of the memory cell.

5. The sensing circuit of claim 1 wherein the state determining circuit comprises a device for determining the positive or negative nature of the difference between the memory cell parameter and the reference cell parameter in order to determine the logic state of the memory cell.

6. The sensing circuit of claim 3 wherein the memory cell sensing circuit comprises a sensing transistor and the reference cell sensing circuit comprises a reference transistor having its gate in common with the gate of the sensing transistor.

7. The sensing circuit of claim 6 wherein the adjusting circuit comprises a voltage adjusting device connected to a back gate of the sensing transistor and/or the reference transistor to selectively modify the voltage on the back gate of the sensing transistor to a balance point where the first reference cell voltage is approximately equal to the first memory cell voltage.

8. The sensing circuit of claim 7 and further comprising an electrical storage device associated with the back gate to maintain the voltage on the back gate at the balance point.

9. The sensing circuit of claim 7 wherein the voltage adjusting device comprises a variable voltage generator and a device for selectively connecting the variable voltage generator to the back gate.

10. The sensing circuit of claim 9 further comprising a comparator in communication with the variable voltage generator and in communication with the memory cell node and the reference cell node for determining the difference between the first memory cell voltage and the first reference cell voltage and for selectively connecting the variable voltage generator to the back gate in response to said difference.

11. The sensing circuit of claim 3, and further comprising a comparator circuit in communication with the memory cell node and the reference cell node for generating an output voltage in response to the difference between the second memory cell voltage and the second reference cell voltage, said difference being indicative of the logic state of the memory cell.

12. A sensing circuit for determining the logic state of a memory cell in a resistive memory device, using a reference cell previously set to a known logic state, comprising:
   (a) a first bias voltage source for applying a first bias voltage to the memory cell and the reference cell;
   (b) a first sensing device for sensing a first memory cell parameter associated with the memory cell and a first reference cell parameter associated with the reference cell, both at the first bias voltage;
   (c) an adjusting device for modifying the first memory cell parameter and/or first reference cell parameter so that the first reference cell parameter is approximately equal to the first memory cell parameter;
   (d) a second bias voltage source for applying a second bias voltage to the memory cell and the reference cell;
   (e) a second sensing device for sensing a second memory cell parameter associated with the memory cell and a second reference cell parameter associated with the reference cell, both at the second bias voltage; and
   (f) a comparing circuit for comparing the difference between the second memory cell parameter and the second reference cell parameter to determine the logic state of the memory cell.

13. The sensing circuit of claim 12 wherein the first and second memory cell parameters are first and second voltages on a memory cell node associated with the memory cell, and wherein the first and second reference cell parameters are first and second reference cell voltages on a reference cell node, associated with the reference cell.

14. A method of determining the logic state of a memory cell in a resistive memory device relative to a reference cell having a pre-selected logic state, comprising:
   (a) sensing a first memory cell parameter associated with the memory cell when a first bias voltage is impressed on the memory cell and sensing a second memory cell parameter associated with the memory cell when a second bias voltage is impressed on the memory cell,
   (b) sensing a first reference cell parameter associated with the reference cell when the first bias voltage is impressed on the reference cell and sensing a second reference cell parameter associated with the reference cell when the second bias voltage is impressed on the reference cell,
   (c) modifying the first memory cell parameter and/or the first reference cell parameter to make the memory cell parameter approximately equal to the reference cell parameter, and
   (d) determining the difference between the second memory cell parameter and the second reference cell parameter in order to determine the logic state of the memory cell.

15. The method of claim 14, wherein the first and second memory cell parameters are first and second voltages on a memory cell node associated with the memory cell, and wherein the first and second reference cell parameters are first and second voltages associated with the reference cell.

16. The method of claim 14, wherein the first and second memory cell parameters are first and second currents associated with the memory cell and the first and second reference cell parameters are first and second currents associated with the reference cell.

17. The method of claim 14 wherein the comparing step involves comparing the difference between the first memory cell voltage and the first reference cell voltage to a threshold value to determine the logic state of the memory cell.

18. The method of claim 14 wherein the comparing step involves determining the positive or negative nature of the difference between the first memory cell voltage and the first reference cell voltage to determine the logic state of the memory cell.

19. The method of claim 15, wherein a sensing transistor is used to sense the memory cell and a reference transistor having its gate in common with the gate of the sensing transistor is used to sense the reference cell.

20. The method of claim 19, wherein the modifying step comprises adjusting the voltage applied to a back gate of the sensing transistor and/or the reference transistor to selectively modify the voltage on the back gate to a balance point where the first reference cell voltage is approximately equal to the first memory cell voltage.

21. The method of claim 20, wherein the voltage on the back gate is maintained at the balance point by an electrical storage device.

22. The method of claim 20, wherein the voltage is adjusted on the back gate by selectively applying a variable voltage generator to the back gate.

23. A method for determining the logic state of a memory cell in a resistive memory device, using a reference cell previously set to a known logic state, comprising:
   (a) applying a first bias voltage to the memory cell and the reference cell;
   (b) measuring a first memory cell parameter associated with the memory cell and a first reference cell parameter associated with the reference cell, both at the first bias voltage;
   (c) adjusting the first memory cell parameter and/or first reference cell parameter so that the first reference cell parameter is approximately equal to the first memory cell parameter;
   (d) applying a second bias voltage to the memory cell and the reference cell;
   (e) measuring a second memory cell parameter associated with the memory cell and a second reference cell parameter associated with the reference cell, both at the second bias voltage; and
   (f) comparing the difference between the second memory cell parameter and the second reference cell parameter to determine the logic state of the memory cell.

24. The method of claim 23 wherein the first and second memory cell parameters are first and second voltages on a memory cell node associated with the memory cell, and wherein the first and second reference cell parameters are first and second reference cell voltages on a reference cell node, associated with the reference cell.

* * * * *